United States Patent [19]

Manley

[11] Patent Number: 5,452,014
[45] Date of Patent: Sep. 19, 1995

[54] VIDEO DAC RISE TIME CONTROL AND SUPPLY NOISE SUPPRESSION

[75] Inventor: Robert B. Manley, Ft. Collins, Colo.

[73] Assignee: Hewlett-Packard Company, Palo Alto, Calif.

[21] Appl. No.: 210,981

[22] Filed: Mar. 21, 1994

[51] Int. Cl.$^6$ .......................... H03M 1/06; H03M 1/78
[52] U.S. Cl. .................................. 348/57 C; 341/118; 341/141; 341/154; 327/202; 327/205
[58] Field of Search ................ 341/150, 141, 118, 144, 341/148, 152, 154; 348/691, 694, 697, 572, 607; H03M 1/00, 1/06, 1/78; 307/290, 272.1, 272.2, 279; 327/205, 206, 202, 204, 203, 208–213

[56] References Cited

U.S. PATENT DOCUMENTS

| | | | |
|---|---|---|---|
| 4,695,743 | 9/1987 | Des Brisay, Jr. | 307/272.2 |
| 5,055,844 | 10/1991 | Kasai | 341/118 |
| 5,155,379 | 10/1992 | Narahara | 307/272.1 |
| 5,331,322 | 7/1994 | Cha et al. | 341/154 |
| 5,334,998 | 8/1994 | Priem et al. | 348/572 |
| 5,369,402 | 11/1994 | Kwon | 341/136 |

Primary Examiner—James J. Groody
Assistant Examiner—Jeffrey S. Murrell

[57] ABSTRACT

Adverse visual effects on a video display caused by switching operations in a digital-to-analog converter of the video subsystem and by parasitic impedance loading the DAC are minimized. Current cells associated with the DAC generate discrete currents for the video display. Each current cell has a current source for providing a current continuously and first and second switching mechanisms. The first switching mechanism is actuated by a select signal for switching the current to a current sink having a dummy resistance $R_d$, and the second switching mechanism is actuated by an nselect signal for switching the current to the video display. The select and nselect signals, are generated from input data. A first feedback loop combines the select signal with the data to derive the nselect signal so that the nselect signal is generated after the select signal decreases to a predefined threshold, preferably zero. A second feedback loop combines the nselect signal with the input data to derive the select signal so that the select signal is generated after the nselect signal decreases to the predefined threshold, preferably zero. Accordingly, the current output from the current source is stabilized by more precise feedback-controlled switching of the first and second switching mechanisms so that the adverse visual effects on the video display are eliminated.

19 Claims, 8 Drawing Sheets

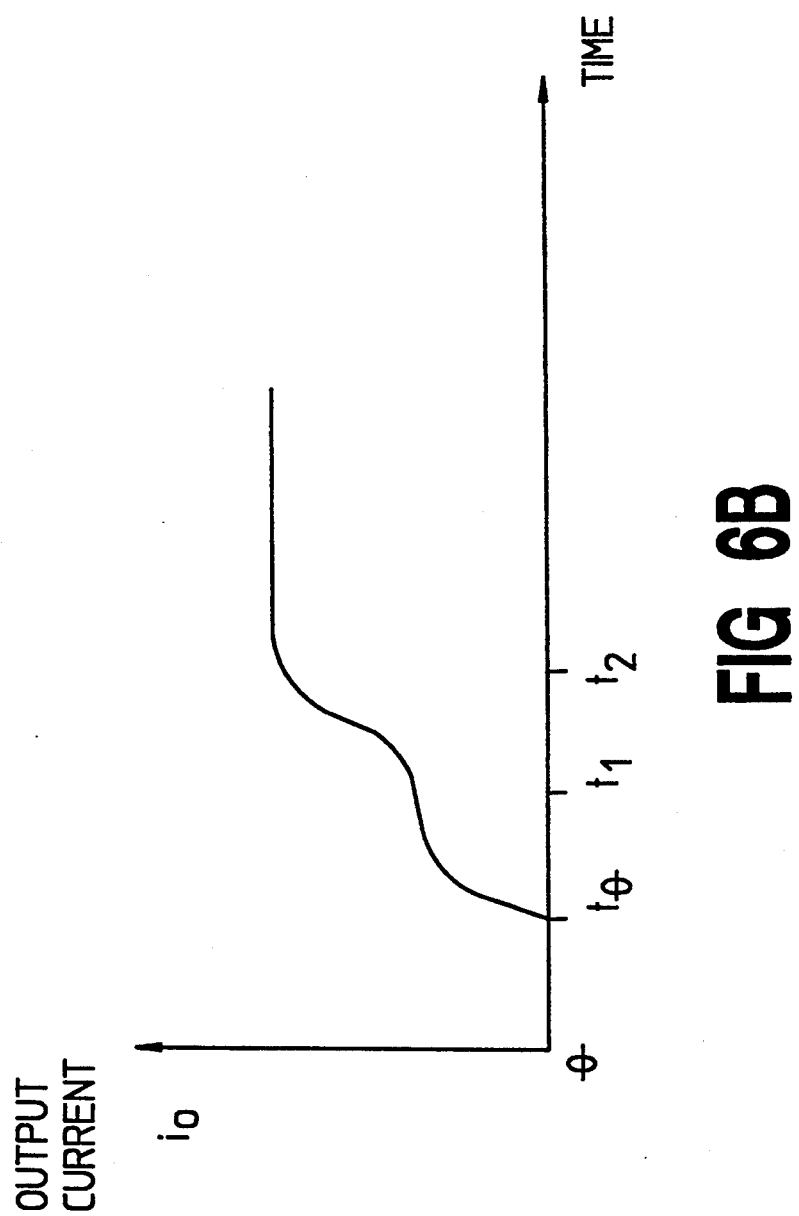

VIDEO DAC RISE TIME CONTROL AND SUPPLY NOISE SUPPRESSION

FIELD OF THE INVENTION

The present invention generally relates to video subsystems and, more particularly, to distortion on a video display caused by switching operations in the digital-to-analog (DAC) converter within the video subsystem driving the video display.

BACKGROUND OF THE INVENTION

Video subsystems for driving video displays often employ video digital-to-analog converters (DACs) for generating any of numerous discrete level currents. These currents are sent to the video display via a transmission line, such as a coaxial cable, which is terminated at each end by an appropriate termination resistor. Typically, the voltage signals generated across these termination resistors by the currents transmitted along the transmission line conform to the well known RS343 computer monitor analog standard.

The DAC is loaded by parasitic impedances, including capacitances and inductances, established by the power supply circuitry connected to the DAC and the output circuitry connected to the DAC. Consequently, as current switching operations occur within the DAC, current fluctuations or surges occur in the power supply circuitry and in the output circuitry connected to the DAC. These current fluctuations adversely affect the image generated by the video display by causing visible distortion thereon. The problem is compounded further with current fluctuations in the power supply circuitry of the DAC, as these current changes cause positive noise feedback to the output circuitry of the DAC.

Furthermore, the switching rate of currents from the DAC must be increased in order to accommodate more sophisticated and higher resolution video displays. The trend in the industry relative to video displays is toward increasing the dot clock, or pixel clock, rate as well as the screen refresh rate. Hence, there is a heretofore unaddressed need in the industry for a system and methodology for increasing the rate of current switching in the DAC of a video subsystem, while minimizing current fluctuations in the power supply circuitry and output circuitry of the DAC, which result from parasitic impedances loading the DAC, in order to thereby eliminate adverse visual effects on the video display.

SUMMARY OF THE INVENTION

An object of the present invention is to overcome the inadequacies and deficiencies of the prior art as noted above and as generally known in the industry.

Another object of the present invention is to provide a system and method for minimizing adverse visual effects on a video display caused by switching operations in a digital-to-analog converter of a video subsystem in combination with parasitic impedance in the video subsystem.

Another object of the present invention is to provide a system and method for switching current within a digital-to-analog converter of a video subsystem driving a video display.

Another object of the present invention is to provide a system and method for increasing the rate of switching operations within a digital-to-analog converter of a video subsystem driving a video display.

Another object of the present invention is to minimize current fluctuations associated with the power supply connected to a digital-to-analog converter of the video subsystem driving a video display.

Another object of the present invention is to minimize current fluctuations at the output of a digital-to-analog converter of the video subsystem driving a video display.

Briefly described, the present invention is a system and method for optimally minimizing adverse visual effects on a video display caused by switching operations in a digital-to-analog converter of a video subsystem in combination with parasitic impedance in the video subsystem. In general, the digital-to-analog converter generates a plurality of discrete currents for the video display, based upon outputs from a plurality of current cells within the converter. Each current cell has a current source for providing a current continuously and a switching means for switching the current alternately to a current sink and to the video display. The current sink preferably comprises a dummy resistance which is equal to an equivalent load resistance imposed upon the current when sent to the video display. The switching means has a first switching mechanism actuated by a select signal for switching the current to ground and a second switching mechanism actuated by an nselect signal for switching the current to the video display. The select and nselect signals are generated from input data to the converter.

In accordance with a significant feature of the present invention, a first feedback loop combines the select signal with the data to derive the nselect signal so that the nselect signal is generated after the select signal decreases to a first predefined threshold, which is preferably zero. Moreover, a second feedback loop combines the nselect signal with the data to derive the select signal so that the select signal is generated after the nselect signal decreases to a second predefined threshold, which is also preferably zero. With the foregoing configuration, currents from the current source within the current cell are stabilized by more precise feedback-controlled switching of the first and second switching transistors so that the adverse visual effects on the video display are optimally minimized and/or eliminated.

In addition to accomplishing all of the objects set forth previously, the present invention has many other advantages, a few of which a listed hereafter.

An advantage of the present invention is that it is simple in design, inexpensive to implement, and reliable as well as efficient in operation.

Another advantage of the present invention is that the dot clock (pixel clock) and the screen refresh rate can be increased to much greater rates.

Another advantage of the present invention is that the switching operations are controlled by feedback, independent of circuit fabrication parameters, power supply fluctuations, and temperature variations.

Another advantage of the present invention is that because of the more precise feedback-controlled switching of the first and second switching transistors, the on states of these transistors can be overlapped a little more in time so that the currents sent from the converter to the video display assume a step-like configuration, which further reduces the possibility of current fluctuations and reduces electromagnetic propagation (RFI).

Other objects, features, and advantages of the present invention will become apparent to one of skill in the art upon examination of the following drawings and detailed description.

BRIEF DESCRIPTION OF THE DRAWINGS

The present invention can be better understood with reference to the following drawings. The drawings are not necessarily to scale, emphasis instead being placed upon clearly illustrating principals of the present invention.

FIG. 6B is a graph illustrating the output current $i_o$ when the novel control logic of FIG. 4 is configured to respond as shown in FIG. 6A.

DETAILED DESCRIPTION OF THE PREFERRED EMBODIMENT

Figure 1:
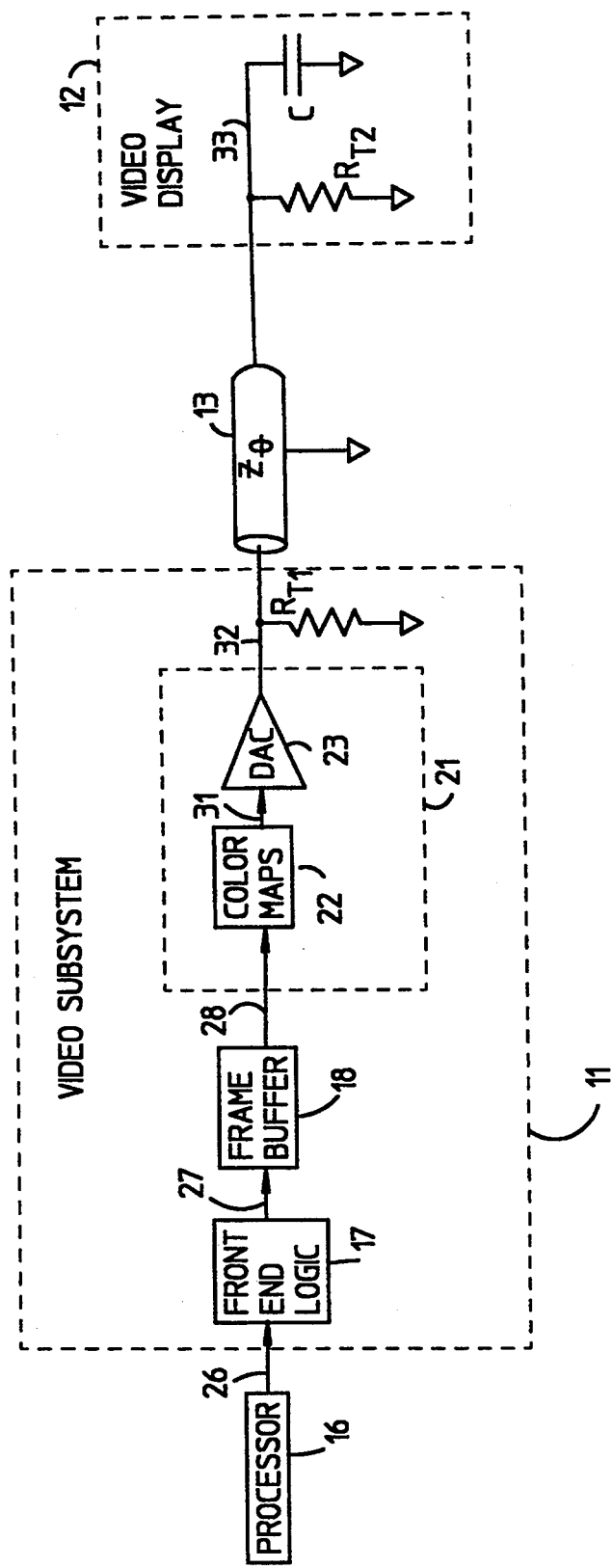
FIG. 1 is a schematic diagram of a video subsystem connected to and driving a video display.

With reference now to the drawings wherein like reference numerals designate corresponding parts throughout the several views, a video subsystem 11 for driving a video display 12 is illustrated in FIG. 1. Generally, the video subsystem 11 and the video display 12 are connected via a transmission line 13, for example, a coaxial cable, having an intrinsic impedance $Z_0$. The video subsystem 11 is connected to a processor 16, which is typically a host computer or dedicated graphics processor, and the video subsystem 11 receives data and operational control signals from the processor 16. In turn, the video subsystem 11 sends data and control signals to the video display 12 via the transmission line 13. Termination transistors $R_{T1}$, $R_{T2}$, generally 75 ohms, are disposed on either side of the transmission line 13 in order to minimize ringing along the transmission line 13. Moreover, the video display 12 can be modeled as a capacitor between the transmission line 13 and ground, as shown in FIG. 1. Typically, the signals transmitted along the transmission line 13 conform to the well known RS343 computer monitor analog standard.

The video subsystem 11 generally comprises front end logic 17, a frame buffer 18 connected to the front end logic 17, and a video digital-to-analog converter (DAC) 21 connected to the frame buffer 18. The front end logic 17 usually has dithering functionality, rasterization functionality, and other signal processing mechanisms. The frame buffer 18 comprises a video random access memory (VRAM). The video DAC 21 has color maps 22 (lookup tables), for example, one for each of the colors red, green, and blue, and a DAC 23 connected to the color maps 22 for converting digital color information into an analog signal which is placed on the transmission line 13.

The operation of the video subsystem 11 is as follows. The processor 16 sends video data to the front end logic 17, which processes the data and places the data in the frame buffer 18. The video DAC 21 retrieves video data from the frame buffer 18 and uses it to look up color data within the color maps 22. The foregoing information is then converted into an analog signal via the DAC 23 and transmitted to the video display 12 via the transmission line 13.

Figure 2:
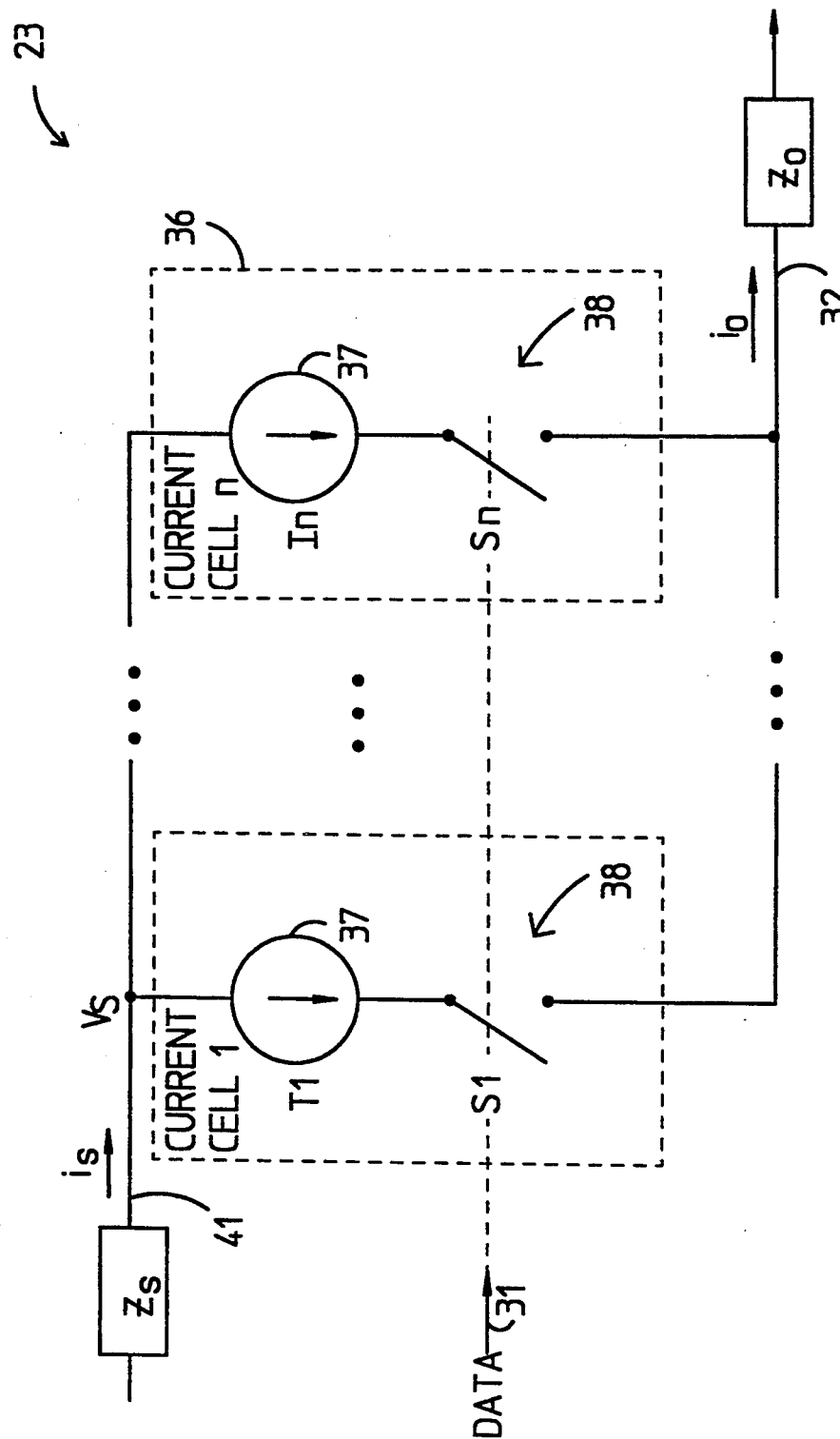
FIG. 2 is a schematic diagram of a plurality of current cells 1 through n situated within the digital-to-analog converter (DAC) of the video subsystem of FIG. 1.

The DAC 23 has a number of parallel current cells 36, as illustrated in FIG. 2, for collectively providing an analog current $i_o$ on line 32 leading to the video display 12. Each of the current cells 36 has a current source 37 and switching mechanism 38 for switching the current from the corresponding current source 37. In typical systems of this nature, the current sources 37 each output the same amount of current and each output essentially the smallest increment (an lsb) of current within the DAC 23. Accordingly, the switches 38 are selectively actuated to produce any of a possible plurality of discrete currents to on line 32. The data passing from the color maps 22 to the DAC 23 along line 31 causes selective actuation of the switching mechanisms 38 after a decoding process.

The output side circuitry connected to the parallel cells 36 at line 32 can be electrically modeled as an equivalent output impedance $Z_o$, and the power supply side circuitry associated with the power supply for providing a supply voltage $V_s$, to the parallel cells 36 can be electrically modeled as an equivalent impedance $Z_s$, as is shown in FIG. 2. As a result of the impedances $Z_o$, $Z_s$ loading down the cells 36, when the current sources 37 are switched on and off by the switching mechanisms 38, current surges $di_o/dt$, $di_s/dt$ are generated on the output line 32 and on the power supply line 41, respectively. Both current changes $di_o/dt$, $di_s/dt$ can undesirably cause distortion on the screen of the video display 12. In essence, the current change $di_o/dt$ directly causes distortion, whereas the current change $di_s/dt$ indirectly causes distortion by generating the current change $di_o/dt$.

Figure 3A:
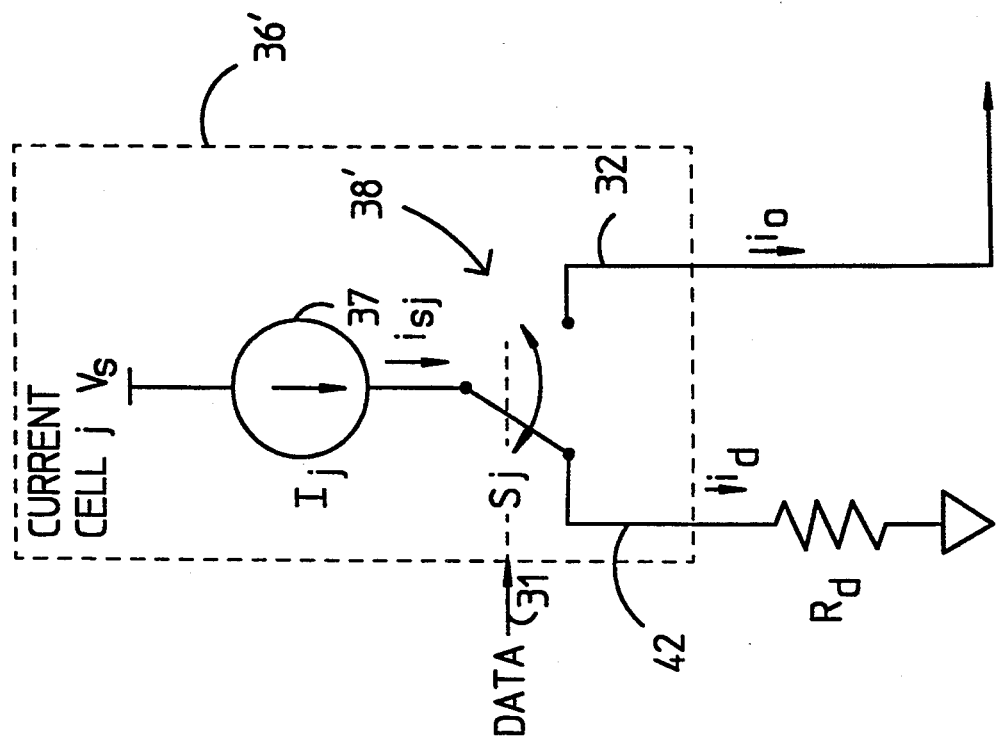
FIG. 3A is a schematic diagram of a modified current cell j within the DAC of the video subsystem of FIG. 1.

Accordingly, in order to minimize the current change $di_s/dt$ at the supply voltage $V_s$, the DAC 23 is oftentimes designed so that the power supply current $i_s$ on line 41 continuously flows into the current cells 36. In order to accomplish this desire, the switching mechanisms 38 are designed to switch current from the current sources 37 to either the output line 32 or to a dump line 42, as is illustrated in FIG. 3A. The dump line 42 is connected to a current sink, which comprises circuitry having an equivalent dummy resistance $R_d$. With reference to FIG. 3A, when the switch 38' connects the current source 37 to the dump line 42 (as shown), then the dump line 42 sinks the current $i_{sj}$ to ground through the dummy resistance $R_d$. The circuitry connected to the dump line 42 having dummy resistance $R_d$ is designed so that the dump line 42 generally responds as an open sink to ground for current flow. ideally, the switching mechanism 38' switches instantaneously and the dummy resistance $R_d$ is equivalent to the resistance exhibited by the output circuitry on the DAC 23 so that there is no fluctuation in the current $i_{sj}$ from the current source 37.

Figure 3B:
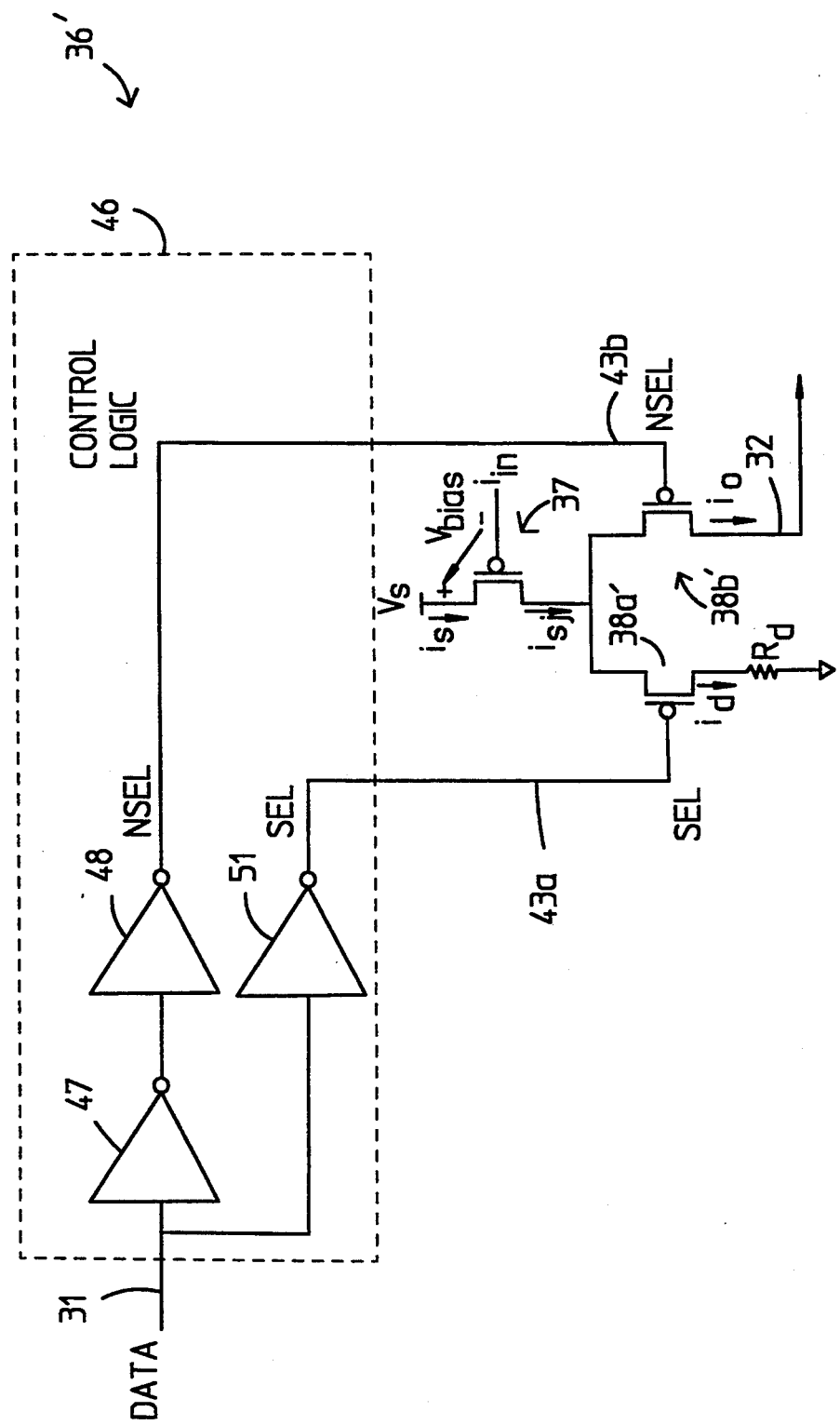
FIG. 3B is a schematic diagram of a specific CMOS implementation of the current cell j of FIG. 3A.

FIG. 3B shows a specific implementation for implementing the current cell 36' of FIG. 3A. As shown in FIG. 3B, the current cell 36' is implemented with CMOS field effect transistors (CMOSFETs; PMOSFET for p-type CMOSFET; NMOSFET for n-type CMOSFET). Specifically, the current source 37 is implemented with a PMOSFET, and the switching mechanism 38' is implemented with PMOSFETs 38a', 38b'. The supply voltage V, applies a voltage bias $V_{bias}$ between the gate and source of the PMOSFET current source 37 so that the PMOSFET current source 37 acts a current amplifier, thereby generating the current $i_{sj}$ from the input current $i_{in}$. The PMOSFET switching mechanisms 38a', 38b' are actuated by logic signals on a select (SEL) line 43a' and an nselect (NSEL) line 43b, respectively. The PMOSFET switching mechanisms 38a', 38b' are turned on by a logic low (in Boolean logic, "0") and turned off by a logic high (in Boolean logic, "1").

The logic signals on the lines 43a, 43b to the PMOSFET switching mechanisms 38a', 38b' are controlled by control logic 46. The control logic 46 receives the input data on line 31, decodes the input data, and actuates the PMOSFET switching mechanisms 38a', 38b' accordingly. In structure, as illustrated in FIG. 3B, the control logic 46 comprises two successive logic inverters 47, 48, preferably CMOSFET logic inverters, for decoding the input data on line 31 and for generating logic signals on the nselect line 43b. Moreover, the control logic 46 comprises a logic inverter 51, preferably a CMOSFET logic inverter, for decoding the input data on line 31 and for generating logic signals on the select line 43a.

The switching mechanisms 38a', 38b' are generally switched on and off alternately, but it is preferred that they be switched on concurrently for a short time, so that the current $i_{sj}$ continuously flows. In other words, this predicament will minimize $di_{sj}/dt$ and consequently $di_o/dt$. If the current $i_{sj}$ is caused to fluctuate as a result of switching operations of the switching mechanisms 38a', 38b', then a current change $di_{in}/dt$ occurs and therefore the voltage $V_{bias}$ across the PMOSFET current source 37 is modulated, which thereby modulates once again the current $i_{sj}$. In effect, a positive feedback situation results. Moreover, if $V_{bias}$ is changed, then the operating point of the PMOSFET current source 37 slightly changes, resulting in a slight change in $i_{sj}$.

In order to accomplish the functionality where the current $i_{sj}$ continuously flows during the switching operations of the switching mechanisms 38a', 38b', the CMOSFET logic inverters 48, 51 are oftentimes ratioed so that their respective outputs 43a, 43b, switch faster from a logic high to a logic low than from a logic low to a logic high. To implement this ratioing, the component NMOSFET (not shown) within the CMOSFET logic inverters 48, 51 is fabricated so that it switches faster than the PMOSFET (not shown) within the CMOSFET logic inverters 48, 51. In general, the widths of a PMOSFET and an NMOSFET having the same switching speed would have a ratio of 1.6/1.0. Therefore, in this embodiment, the ratio of the widths would be modified so that the ratio is less than 1.6/1.0.

Although the current cell 36' of FIG. 3B with ratioing of the CMOSFET logic inverters 48, 51 as described previously is meritorious to an extent, the current cell 36' of FIG. 3B does present problems when the switching rate of the switching mechanisms 38a', 38b' is increased. As the switching rate is increased, distortion undesirably recurs on the video display 12 (FIG. 1) due to inaccurate actuation of the switching mechanisms 38a', 38b'. Furthermore, the switching rate must be increased in order to accommodate more sophisticated and higher resolution video displays 12. The trend in video displays 12 is toward increasing the dot clock, or pixel clock, rate as well as the screen refresh rate.

Ratioing of the logic inverters 48, 51 cannot be trusted to solve the switching (and distortion) problem because the reliability of ratioing is a function of circuit fabrication variables, temperature, and voltage. Moreover, as the dot clock and the screen refresh rate are increased, there is less of a time window for switching of the switching mechanisms 38a', 38b', and consequently, there is a need for very precise control over the switching mechanisms 38a', 38b', which need is not satisfied by ratioing.

Figure 4:
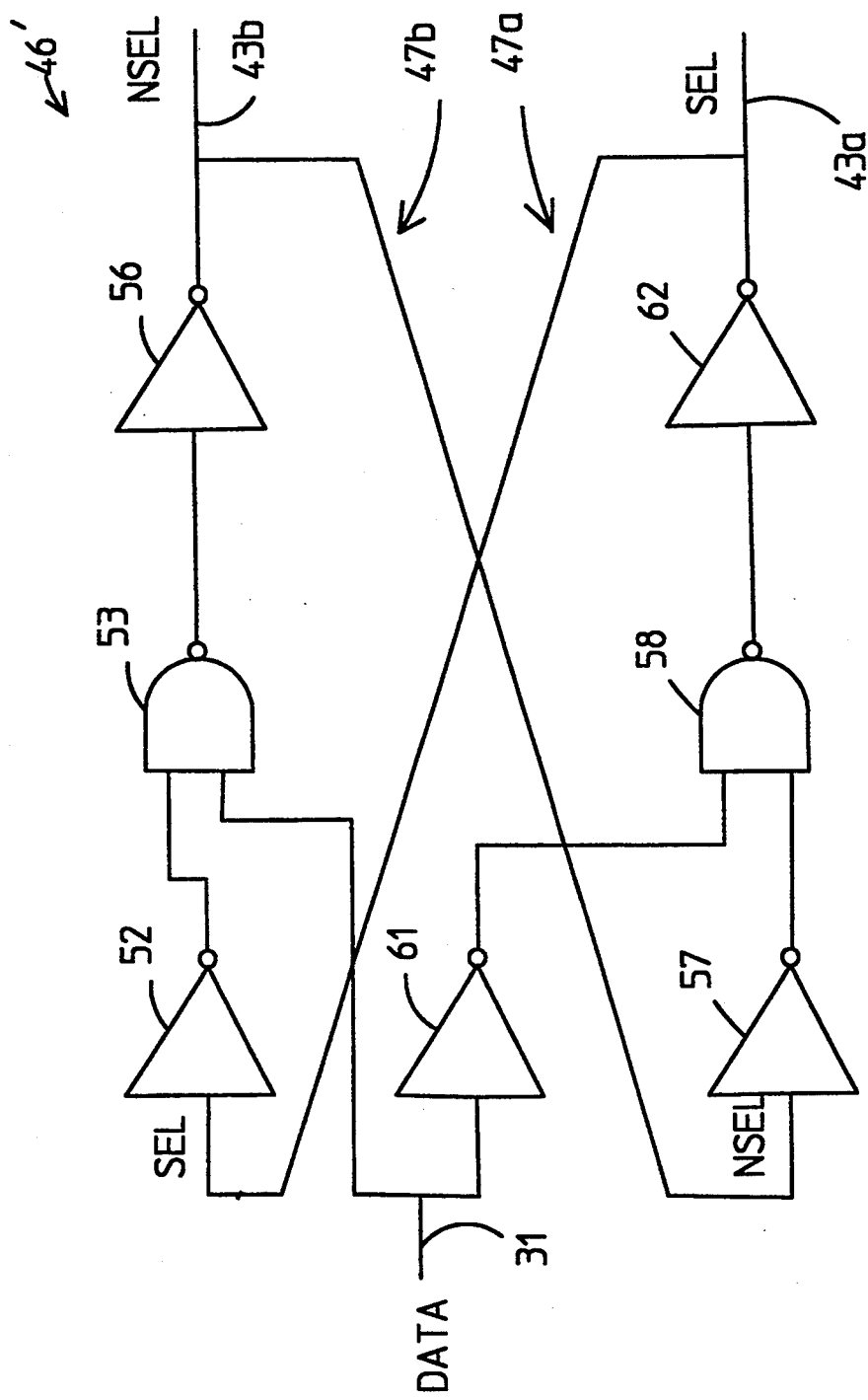
FIG. 4 is a schematic diagram of a novel control logic for FIG. 3B in accordance with the present invention.

FIG. 4 illustrates a novel implementation for the control logic 46 of FIG. 3B for minimizing and/or eliminating adverse visual effects on the video display 12 (FIG. 1) caused by $di_o/dt$, $di_s/dt$, which result from the combination of a high switching rate of the switching mechanisms 38a', 38b' within the DAC 23 and the impedances $Z_s$, $Z_o$ on the power supply side and output side of the DAC 23, respectively.

The control logic 46 generally comprises two feedback loops for triggering the select and nselect signals based upon the voltage amplitude threshold of the nselect and select signals, respectively. More specifically, as shown in FIG. 4, the input data 31 is used to produce the select signal 43a and the nselect signal 43b, but importantly, the select signal 43a and the nselect signal 43b are fed back and combined with the input data 31. The feedback loops are implemented as follows. In the case of the select signal 43a, the select signal 43a is fed back to a logic inverter 52 and then combined with the input data 31 at a NAND logic gate 53. The output of the NAND logic gate 53 is then inverted in a logic inverter 56 in order to generate the nselect signal 43b. Furthermore, in the case of the nselect signal 43b, the nselect signal is fed back to a logic inverter 57 and combined with the inverse of the input data 31 at a NAND logic gate 58. The inverse of the input data 31 is achieved by the logic inverter 61. Moreover, the output of the NAND logic gate 58 is inverted via a logic inverter 62 in order to generate the select signal 43a.

Figure 5:
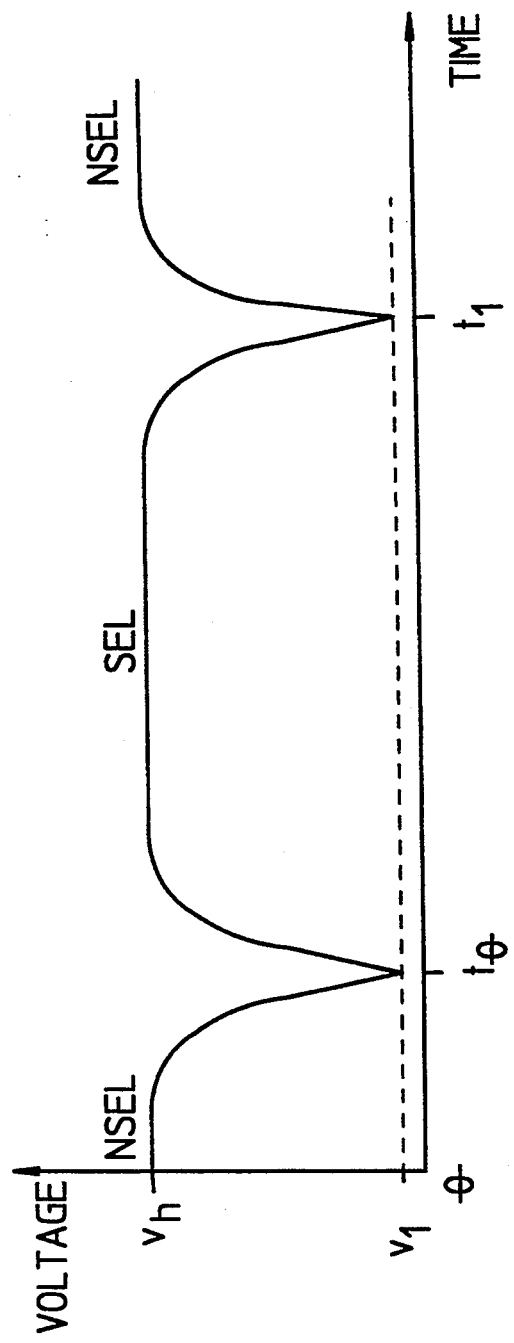
FIG. 5 is a graph illustrating select and nselect signals generated by the novel control logic of FIG. 4.

FIG. 5 illustrates the response of the novel control logic 46 of FIG. 4. In essence, as the nselect signal falls to a voltage threshold $v_1$, i.e., as the switching mechanism 38b' is in the process of turning on, the select signal 43a commences upwardly towards a logic high voltage $v_h$ to thereby commence turning off the transistor 38a'. As the select signal falls to the voltage threshold $v_1$, i.e., as the switching mechanism 38a' is in the process of turning on, the nselect signal 43b commences upwardly towards a logic high voltage $v_h$ to thereby commence turning off the transistor 38b'.

It is desirable that the threshold $v_1$ be as close to zero as possible. With the configuration shown in FIG. 4, this desire is met, as the threshold $v_1$ is very small in magnitude. This feature insures overlapping of the "on" states of switching mechanisms 38a', 38b' without requiring excessive time delays. Hence, the current change $di_s/dt$ is effectively minimized.

Figure 6A:
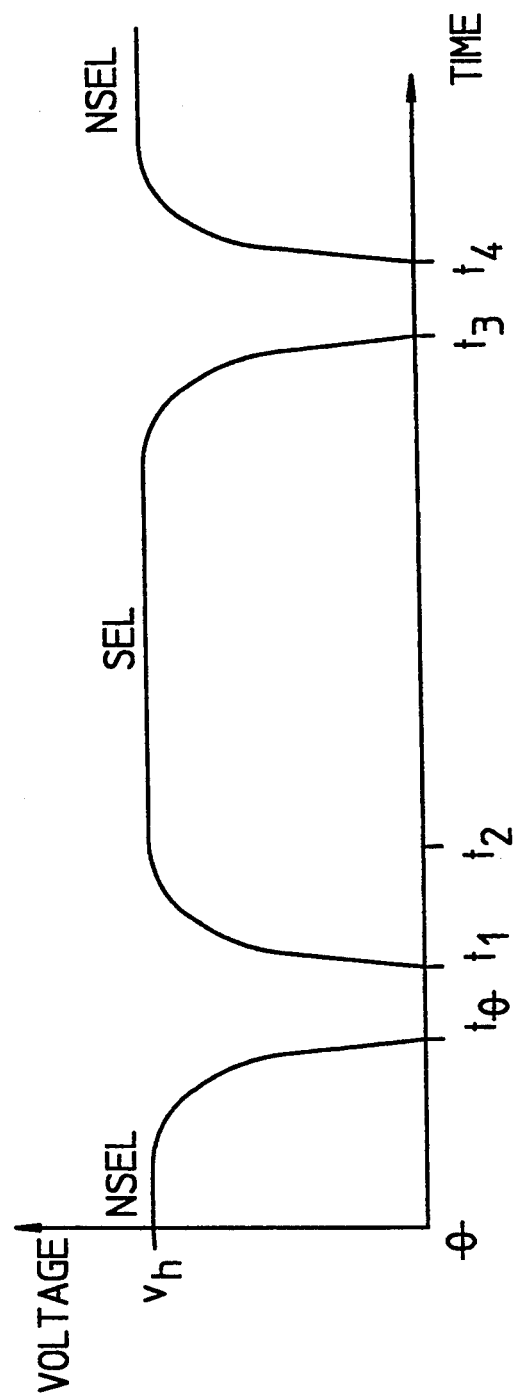
FIG. 6A is a graph of the select and nselect signals generated by the novel control logic of FIG. 4 when a time delay mechanism is placed in the feedback loops of the novel control logic.

In order to reduce the current change $di_o/dt$ on the output side of the DAC 23, the overlap in "on" state of the switching mechanisms 38a', 38b' is increased. This is permissible as a result of the enhanced controllability of the switching mechanisms 38a', 38b', even though the time window is decreased as a result of a faster switching rate. When more of an overlap is introduced, the select signal 43a and the nselect signal 43b transition between logic states as shown in FIG. 6A. As illustrated in FIG. 6A, the nselect signal 43b descends to zero at a time $t_0$. During the time $t_0$ to $t_1$, both of the switching mechanisms 38a', 38b' are in an on condition. At time t1, the select signal 43a begins to ascend to a logic high, i.e., begins to turn off the transistor 38a'. At a time $t_2$, the transistor 38a' is fully turned off, while the transistor 38b' remains in a full on condition. The transistor 38a' is again turned on when the select signal 43a descends to zero at a time $t_3$. During the time from $t_3$ to $t_4$, both of the switching mechanisms 38a', 38b' are in an on condition. The foregoing sequence of events continues on as described.

The response shown in FIG. 6A is implemented by introducing a delay in the feedback loops of FIG. 4. The delay is most easily introduced by ratioing the logic inverters 52, 57 of FIG. 4. Specifically, the logic inverters 52, 57 should be ratioed so that their respective outputs transition faster from a logic high to a logic low than from a logic low to a logic high. Another way of introducing a time delay in the feedback loops is to introduce additional pairs of logic inverters or other logic gates in series with the respective logic inverters 52, 57. This configuration would in effect introduce a time delay, while not changing the ultimate logic state, but at the expense of additional space.

As a result of the logic control response shown in FIG. 6A of the select and nselect signals 43a, 43b, the current output $i_o$ from the DAC 23 assumes a step-like response as illustrated in FIG. 6B. The modified output current $i_o$ optimally minimizes $di_0/dt$, and moreover, the rounded edges of the output current $i_0$ reduces electromagnetic propagation (RFI) from the circuitry. In a sense, because there is an increase in controllability resulting from the novel control logic 46 of FIG. 4, the current switching is spread out over time so as to minimize abrupt changes in the output current $i_0$.

It will be obvious to those skilled in the art that many variations and modifications may be made to the aforementioned embodiments without substantially departing from the principles of the present invention. Accordingly, all such variations and modifications are intended to be included herein within the scope of the present invention, as set forth in the following claims.

Wherefore, the following is claimed:

1. In a digital-to-analog convertor of a video subsystem for generating a plurality of discrete currents for a video display, the convertor having a plurality of parallel current cells connected together for collectively generating the discrete currents, the current cells each having a current source for providing a continuous current and a switch configured to direct the current to a current sink and to the video display, the switch having a first switching mechanism being actuated by a select signal for directing the current to ground and a second switching mechanism actuated by an nselect signal for directing the current to the video display, the select and nselect being generated from input data, the improvement for minimizing adverse visual effects on the video display caused by fluctuation of the current resulting from actuation of the switch and parasitic impedance in the video subsystem, the improvement comprising:

a first feedback loop for combining said select signal with said data to derive said nselect signal;
a second feedback loop for combining said nselect signal with said data to derive said select signal; and
wherein said first and second feedback loops are configured to generate respectively said nselect and said select signals so that said first and second switching mechanisms concurrently provide current during a switching transition of said switch when said continuous current is switched between said current sink and said video display.

2. The improvement of claim 1, further comprising a first time delay means associated with said first feedback loop and a second time delay means associated with said second feedback loop.

3. The improvement of claim 2, wherein said first feedback loop comprises a first logic inverter for inverting said data, a second logic inverter for inverting said nselect signal, a NAND logic gate for combining outputs from said first and second logic inverters, a third logic inverter for receiving a NAND logic gate output and for providing said select signal, and wherein said second feedback loop comprises a fourth logic inverter for inverting said select signal, a NAND logic gate for combining outputs from said fourth logic inverter and said data, and a fifth logic inverter for inverting a NAND logic gate output and providing said nselect signal.

4. The improvement of claim 1, wherein said current sink comprises a dummy resistance which is equal to an equivalent load resistance imposed upon the current passing through said second switching mechanism.

5. The improvement of claim 1, wherein said delay means are implemented by ratioing the widths of a PMOSFET and an NMOSFET within a CMOSFET logic inverter.

6. A system for minimizing adverse visual effects on a video display caused by switching operations in a digital-to-analog convertor of a video subsystem in combination with parasitic impedance in the video subsystem, the convertor for generating a plurality of discrete currents for the video display, the system comprising:

a current cell associated with the digital-to-analog convertor, said current cell for contributing to the discrete currents for the video display, said current cell having a current source for providing a current continuously and a switch for directing the current substantially alternately to a current sink and to the video display, the switch having a first switching mechanism actuated by a select signal for directing the current to the current sink and a second switching mechanism actuated by an nselect signal for directing the current to the video display, the select and nselect signals being generated from input data;
a first feedback loop for combining said select signal with said data to derive said nselect signal so that said nselect signal is generated after said select signal decreases to a first predefined threshold;
a second feedback loop for combining said nselect signal with said data to derive said select signal so that said select signal is generated after said nselect signal decreases to a second predefined threshold;
wherein said first and second feedback loops are configured to generate respectively said nselect and said select signals so that said first and second switching mechanisms concurrently provide current during a switching transition of said switch when said continuous current is switched between said current sink and said video display; and
wherein said current from said current source is stabilized by more precise feedback-controlled switching of said first and second switching mechanisms so that the adverse visual effects on the video display are minimized.

7. The system of claim 5, further comprising a first time delay means associated with said first feedback loop and a second time delay means associated with said second feedback loop.

8. The system of claim 7, wherein said first feedback loop comprises a first logic inverter for inverting said data, a second logic inverter for inverting said nselect signal, a NAND logic gate for combining outputs from said first and second logic inverters, a third logic inverter for receiving a NAND logic gate output and for providing said select signal, and wherein said second feedback loop comprises a fourth logic inverter for inverting said select signal, a NAND logic gate for combining outputs from said fourth logic inverter and said data, and a fifth logic inverter for inverting a NAND logic gate output and providing said nselect signal.

9. The system of claim 7, wherein said delay means are implemented by ratioing the widths of a PMOSFET and an NMOSFET within a CMOSFET logic inverter.

10. The system of claim 5, wherein said current sink comprises a dummy resistance which is equal to an equivalent load resistance imposed upon the current passing through said second switching mechanism.

11. A method for a digital-to-analog convertor of a video subsystem for generating a plurality of discrete currents for a video display, the convertor having a plurality of parallel current cells connected together for collectively generating the discrete currents, the current cells each having a current source for providing a continuous current and a switch for directing the current alternately to a current sink and to the video display, the switch having a first switching mechanism actuated by a select signal for directing the current to a current sink and a second switching mechanism actuated by an nselect signal for directing the current to the video display, the select and nselect signals being generated from input data, the method for minimizing adverse visual effects on the video display caused by fluctuation of the current resulting from actuation of the switching means and parasitic impedance in the video subsystem, the method comprising the steps of:
continuously passing said current through said switch;
combining said select signal with said data to derive said nselect signal; and
combining said nselect signal with said data to derive said select signal; and
generating said nselect and said select signals so that said first and second switching mechanisms concurrently provide current during a switching transition when said continuous current is switched between said current sink and said video display.

12. The method of claim 11, further comprising the step of delaying the combining of said select signal with said data and delaying the combining of said nselect signal with said data.

13. In a digital-to-analog convertor of a video subsystem for generating a plurality of discrete currents for a video display, the convertor having a plurality of parallel current cells connected together for collectively generating the discrete currents, the current cells each having a current source for providing a continuous current and a switch configured to direct the current to a current sink and to the video display, the switch having a first switching mechanism being actuated by a select signal for directing the current to ground and a second switching mechanism actuated by an nselect signal for directing the current to the video display, the select and nselect signals being generated from input data, the improvement for minimizing adverse visual effects on the video display caused by fluctuation of the current resulting from actuation of the switch and parasitic impedance in the video subsystem, the improvement comprising:
a first feedback loop for combining said select signal with said data to derive said nselect signal so that said nselect signal is generated after said select signal decreases to a first predefined threshold, said first feedback loop comprising a first logic inverter for inverting said data, a second logic inverter for inverting said nselect signal, a NAND logic gate for combining outputs from said first and second logic inverters, and a third logic inverter for receiving a NAND logic gate output and for providing said select signal;
a second feedback loop for combining said nselect signal with said data to derive said select signal so that said select signal is generated after said nselect signal decreases to a second predefined threshold, said second feedback loop comprising a fourth logic inverter for inverting said select signal, a NAND logic gate for combining outputs from said fourth logic inverter and said data, and a fifth logic inverter for inverting a NAND logic gate output and providing said nselect signal; and
a first time delay means associated with said first feedback loop and a second time delay means associated with said second feedback loop.

14. The improvement of claim 13, further comprising a first time delay means associated with said first feedback loop and a second time delay means associated with said second feedback loop.

15. The improvement of claim 3, wherein said current sink comprises a dummy resistance which is equal to an equivalent load resistance imposed upon the current passing through said second switching mechanism.

16. The improvement of claim 13, wherein said delay means are implemented by ratioing the widths of a PMOSFET and an NMOSFET within a CMOSFET logic inverter.

17. A system for minimizing adverse visual effects on a video display caused by switching operations in a digital-to-analog convertor of a video subsystem in combination with parasitic impedance in the video subsystem, the convertor for generating a plurality of discrete currents for the video display, the system comprising:
a current cell associated with the digital-to-analog convertor, said current cell for contributing to the discrete currents for the video display, said current cell having a current source for providing a current continuously and a switch for directing the current substantially alternately to a current sink and to the video display, the switch having a first switching mechanism actuated by a select signal for directing the current to the current sink and a second switching mechanism actuated by an nselect signal for directing the current to the video display, the select and nselect signals being generated from input data;
a first feedback loop for combining said select signal with said data to derive said nselect signal so that said nselect signal is generated after said select signal decreases to a first predefined threshold, said first feedback loop comprising a first logic inverter for inverting said data, a second logic inverter for inverting said nselect signal, a NAND logic gate for combining outputs from said first and second logic inverters, and a third logic inverter for receiving a NAND logic gate output and for providing said select signal;

a second feedback loop for combining said nselect signal with said data to derive said select signal so that said select signal is generated after said nselect signal decreases to a second predefined threshold, said second feedback loop comprising a fourth logic inverter for inverting said select signal, a NAND logic gate for combining outputs from said fourth logic inverter and said data, and a fifth logic inverter for inverting a NAND logic gate output and providing said nselect signal;

a first time delay means associated with said first feedback loop and a second time delay means associated with said second feedback loop; and wherein said current from said current source is stabilized by more precise feedback-controlled switching of said first and second switching mechanisms so that the adverse visual effects on the video display are minimized.

18. The system of claim 17, wherein said current sink comprises a dummy resistance which is equal to an equivalent load resistance imposed upon the current passing through said second switching mechanism.

19. The system of claim 17, wherein said delay means are implemented by ratioing the widths of a PMOSFET and an NMOSFET within a CMOSFET logic inverter.

* * * * *